(12) United States Patent
Hino

(10) Patent No.: US 10,171,059 B2
(45) Date of Patent: Jan. 1, 2019

(54) COMPOSITE COMPONENT AND FRONT-END MODULE

(71) Applicant: Murata Manufacturing Co., Ltd., Kyoto (JP)

(72) Inventor: Seigo Hino, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/417,652

(22) Filed: Jan. 27, 2017

(65) Prior Publication Data

US 2017/0133998 A1    May 11, 2017

Related U.S. Application Data

(63) Continuation of application No. PCT/JP2015/074905, filed on Sep. 2, 2015.

(30) Foreign Application Priority Data

Sep. 8, 2014    (JP) .................................. 2014-182648

(51) Int. Cl.
*H03H 7/01*    (2006.01)
*H05K 7/14*    (2006.01)
(Continued)

(52) U.S. Cl.
CPC ............ *H03H 7/0115* (2013.01); *H01L 25/00* (2013.01); *H03F 3/19* (2013.01); *H03F 3/245* (2013.01);
(Continued)

(58) Field of Classification Search
CPC ............ H03K 1/144; H03K 2201/042; H03H 7/0161; H03H 7/175; H03H 9/46;
(Continued)

(56) References Cited

U.S. PATENT DOCUMENTS 7,183,622 B2 *    2/2007   Heck ..................... B81C 1/0023
                                                               257/528
7,379,751 B2 *    5/2008   Wada ..................... H04B 1/005
                                                               330/126
(Continued)

FOREIGN PATENT DOCUMENTS

JP    2006-033052 A    2/2006
JP    2006-261387 A    9/2006
(Continued)

OTHER PUBLICATIONS

International Search Report issued in Application No. PCT/JP2015/074905 dated Dec. 1, 2015.
(Continued)

*Primary Examiner* — Dinh T Le
(74) *Attorney, Agent, or Firm* — Pearne & Gordon LLP

(57) ABSTRACT

An object is to provide a technique that can reduce the degradation in the characteristics of a transmitting filter by improving heat dissipation characteristics of a composite component having a stack structure. Since a transmitting filter is disposed in or on a first substrate 14, the heat generated in the transmitting filter is efficiently dissipated, for example, to an external module substrate 2 electrically connected to the first substrate 14. It is thus possible to reduce changes in the characteristics of the transmitting filter caused by a temperature rise. Thus, by improving heat dissipation characteristics of a composite component 10 having a stack structure, the degradation in the characteristics of the transmitting filter can be reduced.

19 Claims, 8 Drawing Sheets

(51) Int. Cl.
- *H03F 3/19* (2006.01)
- *H01L 25/00* (2006.01)
- *H04B 1/40* (2015.01)
- *H03F 3/24* (2006.01)
- *H03H 9/46* (2006.01)
- *H05K 1/14* (2006.01)
- *H05K 1/18* (2006.01)
- *H03H 9/05* (2006.01)
- *H05K 1/02* (2006.01)

(52) U.S. Cl.
CPC .......... *H03H 7/0161* (2013.01); *H03H 7/175* (2013.01); *H03H 7/1766* (2013.01); *H03H 9/46* (2013.01); *H04B 1/40* (2013.01); *H05K 1/0243* (2013.01); *H05K 1/141* (2013.01); *H05K 1/144* (2013.01); *H05K 1/181* (2013.01); *H01L 2924/0002* (2013.01); *H03F 2200/451* (2013.01); *H03H 9/0566* (2013.01); *H05K 1/0218* (2013.01); *H05K 2201/042* (2013.01); *H05K 2201/0723* (2013.01); *H05K 2201/1006* (2013.01); *H05K 2201/2036* (2013.01)

(58) Field of Classification Search
CPC ... H03H 7/0115; H03F 3/19; H03F 2200/451; H03F 3/245

USPC ......... 257/528, 106; 455/73, 78, 550.1, 561; 333/187, 193

See application file for complete search history.

(56) References Cited

U.S. PATENT DOCUMENTS

| | | | | |
|---|---|---|---|---|
| 7,983,624 | B2* | 7/2011 | Knecht | ............ H04B 1/18 455/550.1 |
| 8,294,535 | B2* | 10/2012 | Feiertag | ............ H03H 9/059 29/25.35 |
| 2015/0123744 | A1 | 5/2015 | Nishimura | |

FOREIGN PATENT DOCUMENTS

| | | |
|---|---|---|
| JP | 2007-067617 A | 3/2007 |
| JP | 2007-142812 A | 6/2007 |
| JP | 2010-010765 A | 1/2010 |
| JP | 2014-003460 A | 1/2014 |
| JP | 2015-091065 A | 5/2015 |
| WO | 2006/035518 A1 | 4/2006 |

OTHER PUBLICATIONS

Written Opinion issued in Application No. PCT/JP2015/074905 dated Dec. 1, 2015.

* cited by examiner

COMPOSITE COMPONENT AND FRONT-END MODULE

This is a continuation of International Application No. PCT/JP2015/074905 filed on Sep. 2, 2015 which claims priority from Japanese Patent Application No. 2014-182648 filed on Sep. 8, 2014. The contents of these applications are incorporated herein by reference in their entireties.

BACKGROUND OF THE DISCLOSURE

Field of the Disclosure

The present disclosure relates to a composite component including a transmitting filter and a receiving filter, and also relates to a front-end module including the composite component.

Description of the Related Art

Conventionally, a composite component having a stack structure has been provided to reduce the module size in a plan view (see, e.g., Patent Document 1). As in the case of a conventional composite component 500 having a stack structure illustrated in FIG. 11, the stack structure is a structure in which a spacer member 502 is disposed on the upper surface of a first substrate 501 and a second substrate 503 is disposed on the spacer member 502, whereby the first substrate 501 having various components 504 mounted thereon and the second substrate 503 having various components 505 mounted thereon are spaced in the direction orthogonal to the component mounted surfaces of the substrates 501 and 503. In the example illustrated in FIG. 11, the components 504 and 505 are disposed between the first substrate 501 and the second substrate 503.

Patent Document 1: Japanese Unexamined Patent Application Publication No. 2006-261387 (e.g., Paragraphs 0046 and 0047, FIG. 1, and Abstract)

BRIEF SUMMARY OF THE DISCLOSURE

When the composite component 500 is mounted on a front-end module disposed directly below an antenna element, the composite component 500 is formed, for example, in the following manner. That is, the composite component 500 is formed to include a transmission path through which a transmission signal passes, a reception path through which a reception signal passes, and a transmitting filter disposed in the transmission path. The front-end module includes a power amplifier. After a transmission signal amplified by the power amplifier passes through the transmitting filter disposed in the transmission path, the transmission signal is outputted from the front-end module to the antenna element.

Since the transmission signal is amplified to a high power level by the power amplifier, the transmitting filter generates heat due to passage of the transmission signal. Additionally, the temperature of the transmitting filter may rise due to the influence of heat radiated from the power amplifier, which is a heat generating component, or heat conducted through the transmission path. If the temperature of the transmitting filter rises, the circuit constant of a circuit device forming the transmitting filter may change depending on the temperature characteristics of the circuit device, and the characteristics of the transmitting filter may be degraded.

The present disclosure has been made in view of the problems described above. An object of the present disclosure is to provide a technique that can reduce the degradation in the characteristics of a transmitting filter by improving heat dissipation characteristics of a composite component having a stack structure.

To achieve the object described above, a composite component according to the present disclosure, the composite component being disposed on a mounting substrate, includes a transmitting filter; a first substrate disposed adjacent to the mounting substrate and electrically connected to the mounting substrate; a second substrate disposed opposite the first substrate; and a spacer member interposed between the first substrate and the second substrate to support the first substrate and the second substrate, the spacer member being configured to electrically connect the first substrate to the second substrate. The second substrate is electrically connected to the mounting substrate, with the spacer member interposed therebetween. The transmitting filter is disposed in an internal space and on a principal surface of the first or second substrate, the internal space being surrounded by the first substrate and the second substrate.

In the disclosure configured as described above, the transmitting filter that generates a large amount of heat due to passage of a transmission signal is disposed in the internal space surrounded by the first substrate and the second substrate and on the principal surface of the first or second substrate. This allows the heat generated in the transmitting filter to be efficiently dissipated, for example, to the external mounting substrate electrically connected to the first substrate and the second substrate. Since this prevents an excessive rise in the temperature of the transmitting filter, it is possible to reduce changes in the characteristics of the transmitting filter. Thus, by improving heat dissipation characteristics of the composite component having a stack structure, the degradation in the characteristics of the transmitting filter can be reduced.

The transmitting filter may be disposed in the internal space and on the principal surface of the first substrate.

In this case, the transmitting filter is disposed on the principal surface of the first substrate adjacent to the mounting substrate. Since this configuration does not require a long heat conduction path, the heat dissipation characteristics of the transmitting filter can be improved.

The transmitting filter may include a resonant circuit, and the resonant circuit may be disposed in the internal space and on the principal surface of the first substrate.

In this configuration, the resonant circuit of the transmitting filter that generates a large amount of heat due to passage of resonant current is disposed on the principal surface of the first substrate adjacent to the mounting substrate. Since this configuration does not require a long heat conduction path, the heat dissipation characteristics of the resonant circuit can be improved, and the heat generated in the resonant circuit can be efficiently dissipated to the mounting substrate electrically connected to the first substrate. This prevents an excessive rise in the temperature of the resonant circuit, and hence it is possible to reduce the changes in the resonant frequency of the resonant circuit from a desired value. It is thus possible to further reduce the degradation in the characteristics of the transmitting filter.

The composite component may include a receiving filter, and the receiving filter may be disposed in the internal space and on the principal surface of the second substrate.

The receiving filter does not require heat dissipation characteristics. Therefore, when the receiving filter is disposed on the principal surface of the second substrate in the internal space surrounded by the first substrate and the second substrate, it is possible to make effective use of the internal space. Additionally, since the heat generated in the transmitting filter is efficiently dissipated to the outside of the composite component, it is possible to prevent a temperature rise in the receiving filter caused by the heat generated in the transmitting filter, and thus to reduce the degradation in the characteristics of the receiving filter.

Part of the heat generated in the transmitting filter is transmitted through the spacer member to the second substrate. When the transmitting filter and the receiving filter are disposed in the internal space between the first substrate and the second substrate and the upper surface of the second substrate has no components thereon, the heat transmitted to the second substrate can be efficiently dissipated to the outside from the entire upper surface of the second substrate.

The receiving filter is disposed not on the first substrate having thereon the transmitting filter which may generate the highest heat, but on the principal surface of the second substrate distant from the transmitting filter. Therefore, since a temperature rise in the receiving filter caused by the conduction or radiation of the heat generated in the transmitting filter can be suppressed, it is possible to further reduce the degradation in the characteristics of the receiving filter.

The spacer member may be a metal conductor.

With this configuration, for example, when the transmitting filter is disposed on the first substrate, part of the heat generated in a transmitting circuit is efficiently transmitted through the metal conductor having high thermal conductivity to the second substrate and dissipated from the upper surface of the second substrate to the outside. It is thus possible to further efficiently suppress a temperature rise in the transmitting filter and the composite component. Additionally, since the first substrate and the second substrate are electrically connected by the metal conductor having high electrical conductivity, an electrical loss during transmission of signals between the first substrate and the second substrate can be reduced. The composite component with no significant insertion loss can thus be provided.

The composite component may include a plurality of first substrate-side filters arranged on an upper surface of the first substrate, and a plurality of second substrate-side filters arranged on a lower surface of the second substrate. Of the plurality of first and second substrate-side filters, the corresponding first and second substrate-side filters arranged to coincide with each other in a plan view may have respective pass bands set in different frequency bands.

With this configuration, the influence of signals passing through one of the corresponding first and second substrate-side filters arranged to coincide with each other in a plan view on the other filter can be suppressed.

The composite component may include a plurality of first substrate-side filters arranged on an upper surface of the first substrate, a plurality of second substrate-side filters arranged on a lower surface of the second substrate, and a filter controller configured to control an operation of each of the plurality of first substrate-side filters and an operation of each of the plurality of second substrate-side filters. The filter controller may perform the control such that of the plurality of first and second substrate-side filters, the corresponding first and second substrate-side filters arranged to coincide with each other in a plan view do not operate simultaneously.

With this configuration, one of the corresponding first and second substrate-side filters arranged to coincide with each other in a plan view does not operate while the other filter is operating. It is thus possible to reduce the degradation in filter characteristics caused by interaction between electromagnetic fields generated from both of the filters by the simultaneous operation.

The plurality of first substrate-side filters may each be the transmitting filter, and the plurality of second substrate-side filters may each be the receiving filter.

Typically, external connection terminals formed on the lower surface of the first substrate are electrically connected, for example, to the external mounting substrate. The external connection terminals typically include a ground terminal connected to a ground path. In the transmitting filters, electromagnetic waves greater than those in the receiving filters may be generated because transmission signals having a signal level higher than that of reception signals are inputted to the transmitting filters. In the configuration described above, the transmitting filters can be disposed at a position close to the ground path, and hence the influence of electromagnetic waves generated in the transmitting filters can be reduced.

The first substrate may include a first ground electrode formed in a planar shape to overlap all components on the first substrate in a plan view.

With this configuration, the heat generated in the transmitting filter can be further efficiently dissipated to the outside of the composite component, through the first ground electrode formed in a planar shape to overlap substantially with the entire surface of the first substrate in a plan view. It is thus possible to further reduce the degradation in the characteristics of the transmitting filter. It is also possible to further effectively reduce the influence of electromagnetic waves generated from the transmitting filter.

The second substrate may include, at a position adjacent to an upper surface thereof, a second ground electrode formed in a planar shape to overlap all components on the second substrate in a plan view.

With this configuration, the heat transmitted from the first substrate to the second substrate can be further efficiently dissipated from the upper surface of the second substrate to the outside, through the second ground electrode formed in a planar shape to overlap substantially with the entire surface of the second substrate in a plan view. It is thus possible to further reduce the degradation in the characteristics of the transmitting filter.

The resonant circuit may include a variable reactance circuit, and the variable reactance circuit may be disposed in the internal space and on the principal surface of the first substrate.

With this configuration, since the resonant circuit is formed using the variable reactance circuit, the resonant frequency of the resonant circuit can be varied by the variable reactance circuit in accordance with the frequency band of a transmission signal passing through the composite component. Therefore, since the transmitting filter that can accommodate transmission signals in a plurality of frequency bands with one resonant circuit can be formed, the size of the transmitting filter can be reduced. It is also possible to provide the composite component that can accommodate a plurality of transmission signals in different frequency bands. Although the variable reactance circuit tends to generate heat because it typically includes such a component as a switch, the heat generated in the resonant circuit including the variable reactance circuit can be efficiently dissipated to the outside of the composite component. It is thus possible not only to reduce the degradation in the characteristics of the transmitting filter, but also to provide the high-performance composite component which is capable of accommodating transmission signals in a plurality of frequency bands.

A front-end module according to the present disclosure includes the composite component according to any one of Claims 1 to 11. The front-end module further includes a power amplifier, and the power amplifier is disposed outside the composite component.

In the present disclosure configured as described above, the power amplifier that generates heat is disposed outside the stack structure of the composite component. It is thus possible to suppress a temperature rise in the composite component caused by heat of the power amplifier. Even when the composite component is heated by heat radiated from the power amplifier or by heat conducted through the transmission path, the degradation in the characteristics of the transmitting filter can be reduced by improving the heat dissipation characteristics of the composite component having a stack structure. It is thus possible to provide the front-end module that can reduce degradation of its characteristics.

According to the present disclosure, since the transmitting filter is disposed on the first or second substrate, the heat generated in the transmitting filter is efficiently dissipated, for example, to the external mounting substrate electrically connected to the first substrate. It is thus possible to suppress a temperature rise in the transmitting filter and reduce changes in the characteristics of the transmitting filter. Thus, by improving heat dissipation characteristics of the composite component having a stack structure, the degradation in the characteristics of the transmitting filter can be reduced.

BRIEF DESCRIPTION OF THE SEVERAL VIEWS OF THE DRAWINGS

Each of FIGS. 10A, 10B and 10C illustrates a composite component according to a fifth embodiment of the present disclosure.

DETAILED DESCRIPTION OF THE DISCLOSURE

First Embodiment

Figure 1:
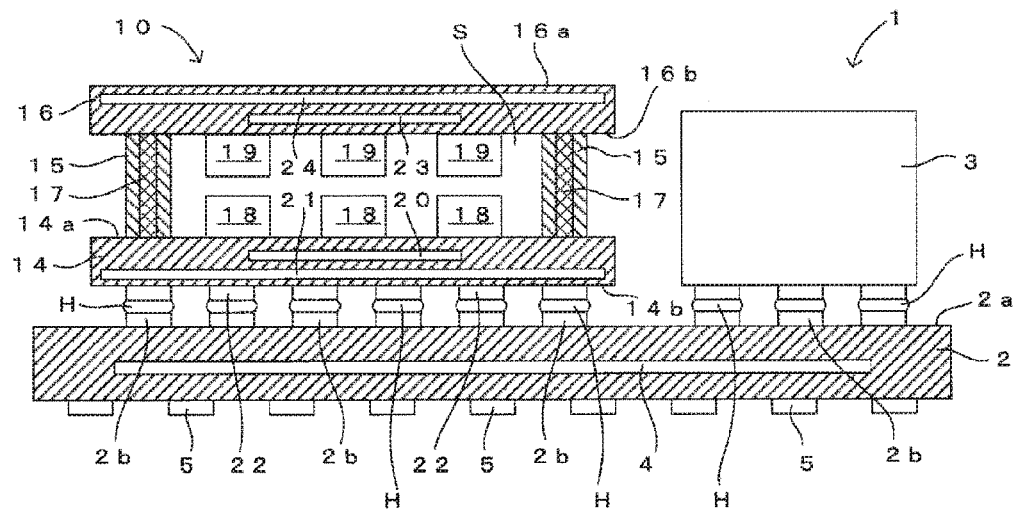
FIG. 1 is a partial cross-sectional view of a front-end module according to a first embodiment of the present disclosure.
Figure 2:
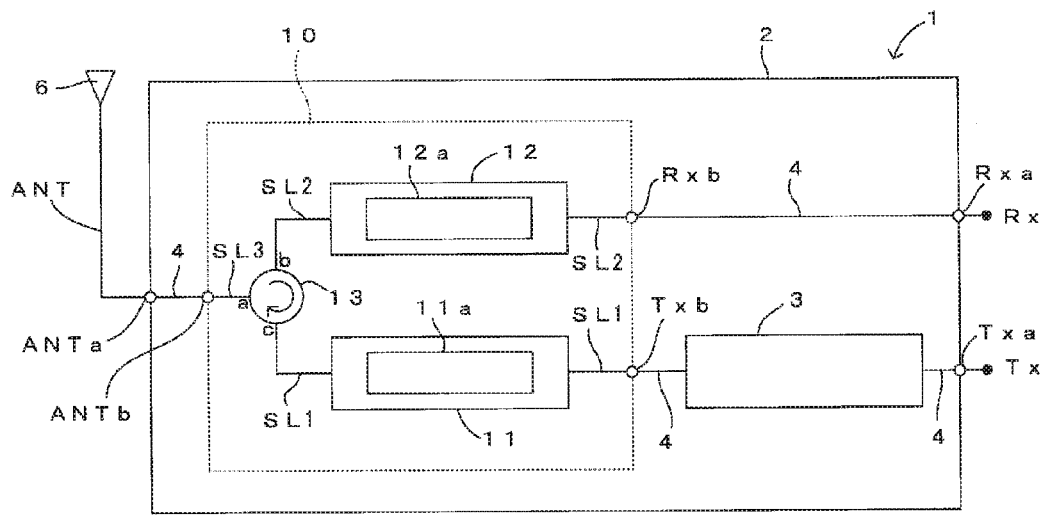
FIG. 2 is a circuit block diagram illustrating an electrical configuration of the front-end module illustrated in FIG. 1.
Figure 5A:
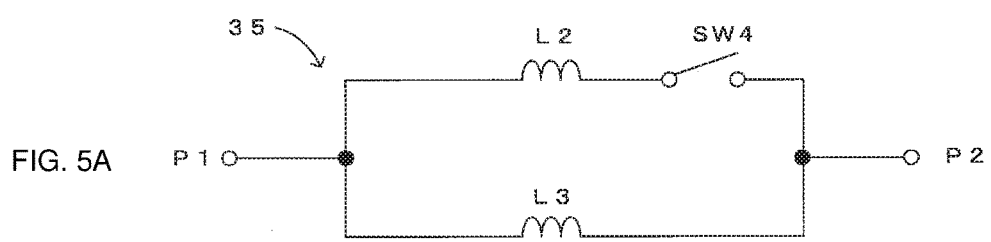
FIGS. 5A and 5B each illustrate a different variable reactance circuit that varies the inductive reactance.
Figure 5B:
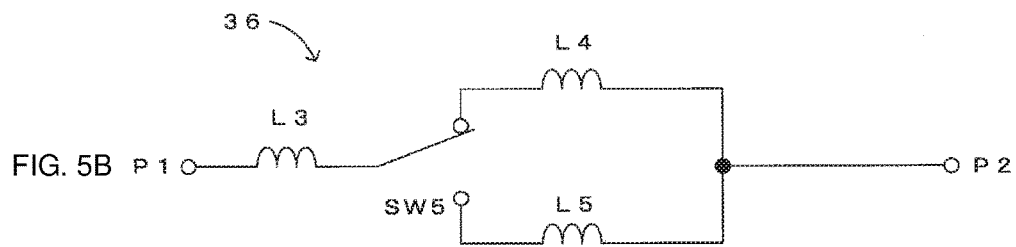
Figure 6:
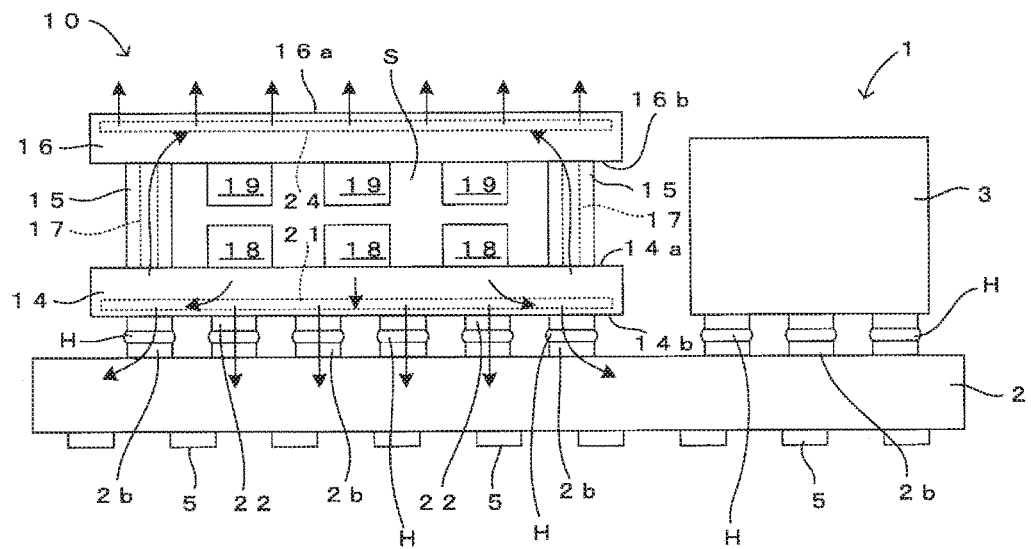
FIG. 6 is a diagram for explaining the dissipation of the heat from a composite component.

A front-end module according to a first embodiment of the present disclosure will be described with reference to FIGS. 1 to 6. FIG. 1 is a partial cross-sectional view of the front-end module according to the first embodiment of the present disclosure. FIG. 2 is a circuit block diagram illustrating an electrical configuration of the front-end module illustrated in FIG. 1. FIGS. 3A to 3F each illustrate a different resonant circuit included in a transmitting filter or a receiving filter. FIGS. 4A to 4E each illustrate a different variable reactance circuit that varies the capacitive reactance. FIGS. 5A and 5B each illustrate a different variable reactance circuit that varies the inductive reactance. FIG. 6 is a diagram for explaining the dissipation of the heat from a composite component.

Note that FIGS. 1 and 2 illustrate only major elements of the present disclosure, and omit the illustration of the other elements to simplify the explanation. The other drawings to be referred to in the following description also illustrate only major elements as in the case of FIGS. 1 and 2, and their explanation is omitted in the following description.

(Front-End Module)

A front-end module 1 illustrated in FIGS. 1 and 2 is mounted on a motherboard included in a mobile communication terminal, such as a cellular phone or a personal digital assistant, and is positioned directly below an antenna element. In the present embodiment, the front-end module 1 includes a module substrate 2 (mounting substrate), a power amplifier 3, and a composite component 10 including a transmitting filter 11 and a receiving filter 12. Although not shown in FIGS. 1 and 2, various components for forming a matching circuit and a filter circuit, such as a resistor, a capacitor, and an inductor, and various other components, such as a low-noise amplifier and a switch IC, are appropriately selected in accordance with functions required for the front-end module 1, and mounted on the module substrate 2.

The power amplifier 3, the composite component 10, and various other components are mounted on mounting electrodes 2b on a mounting surface 2a of the module substrate 2 using a bonding material, such as solder H, and are electrically connected, through a wiring electrode 4 in the module substrate 2, to a plurality of mounting electrodes 5 formed on the back surface of the module substrate 2 and to other components mounted on the module substrate 2. A transmitting electrode Txa to which a transmission signal is externally inputted, a common electrode ANTa configured to output the transmission signal to the outside (antenna element 6) and receive a reception signal externally inputted thereto, a receiving electrode Rxa configured to output the reception signal inputted to the common electrode ANTa, and a ground electrode (not shown) connected to a ground path (not shown) are formed by the mounting electrodes 5.

In the present embodiment, the module substrate 2 is formed by a ceramic multilayer body obtained by stacking and firing a plurality of dielectric layers formed by ceramic green sheets. Specifically, a ceramic green sheet forming each dielectric layer is obtained by putting a slurry made by mixing a mixed powder of alumina and glass with an organic binder and a solvent into a mold, and is formed so that it can be fired at a temperature as low as about 1000° C. (low-temperature firing). In a ceramic green sheet cut in a predetermined shape, via holes are formed, for example, by laser processing. By filling the via holes with a conductive paste containing Ag or Cu, or by applying via-fill plating to the via holes, via conductors for interlayer connection are obtained. Then, by printing a conductive paste on the surface of the ceramic green sheet, various in-plane conductive patterns are formed. Each dielectric layer is thus obtained.

By appropriately forming via conductors and in-plane conductive patterns for each dielectric layer, various electrodes, such as the wiring electrode 4 and the mounting electrodes 5 are formed in and on the module substrate 2. The via conductors and in-plane conductive patterns formed for each dielectric layer may form circuit devices, such as a capacitor and an inductor. The circuit devices, such as a capacitor and an inductor, may form a filter circuit and a matching circuit in the module substrate 2. The circuit devices formed in and on the module substrate 2 by the via conductors and the in-plane conductive patterns may be combined with various components mounted on the module substrate 2 to form a filter circuit and a matching circuit.

The module substrate 2 may be formed by a printed circuit board, an LTCC substrate, an alumina substrate, a glass substrate, a composite substrate, a single-layer substrate, or a multi-layer substrate using a resin, ceramic, or polymer material. The module substrate 2 may be formed by appropriately selecting the most suitable material for the intended use of the front-end module 1.

The power amplifier 3 is configured to amplify the signal level of a transmission signal inputted from the motherboard of the mobile communication terminal to the transmitting electrode Txa, and to output the transmission signal through a transmitting terminal Txb of the composite component 10 to the input side of the transmitting filter. An amplifying circuit included in the power amplifier 3 may be formed by any generally used power amplifying device, such as a heterojunction bipolar transistor or a field effect transistor. The configuration of the power amplifier 3 will not be described in detail.

(Composite Component)

The composite component 10 will be described.

(1) Overview of Electrical Configuration

An overview of an electrical configuration of the composite component 10 will be described. As illustrated in FIG. 2, the composite component 10 includes a transmission path SL1 through which a transmission signal passes, a reception path SL2 through which a reception signal passes, a common path SL3 through which the transmission signal and the reception signal pass, the transmitting filter 11 in the transmission path SL1, the receiving filter 12 in the reception path SL2, a circulator 13 connected to the paths SL1, SL2, and SL3, the transmitting terminal Txb, a common terminal ANTb, a receiving terminal Rxb, and a ground terminal (not shown).

The transmitting terminal Txb is connected through the transmission path SL1 to the input side of the transmitting filter 11, and the output side of the transmitting filter 11 is connected through the transmission path SL1 to a third port "c" of the circulator 13. A first port "a" of the circulator 13 is connected through the common path SL3 to the common terminal ANTb. A second port "b" of the circulator 13 is connected through the reception path SL2 to the input side of the receiving filter 12, and the output side of the receiving filter 12 is connected through the reception path SL2 to the receiving terminal Rxb.

A predetermined transmission frequency band is set as the pass band of the transmitting filter 11. Transmission signals outputted from the power amplifier 3 and inputted to the transmitting terminal Txb are attenuated by the transmitting filter 11, except for those in the predetermined transmission frequency band, and outputted to the third port "c" of the circulator 13. A predetermined reception frequency band is set as the pass band of the receiving filter 12. Reception signals from the second port "b" of the circulator 13 are attenuated by the receiving filter 12, except for those in the predetermined reception frequency band, and outputted to the receiving terminal Rxb.

The transmitting filter 11 includes a resonant circuit 11a, and the receiving filter 12 includes a resonant circuit 12a. The resonant circuits 11a and 12a are each formed by a surface acoustic wave resonator, a bulk acoustic wave resonator, or a piezoelectric resonator using a boundary acoustic wave, or formed by a typical LC resonator obtained by combining an inductor and a capacitor.

Specifically, the transmitting filter 11 is formed, for example, by connecting a plurality of piezoelectric resonators in a ladder form. The receiving filter 12 is formed, for example, by connecting in series an acoustic wave resonator forming a phase shifter and a longitudinally-coupled acoustic wave resonator forming a band pass filter.

That is, the transmitting filter 11 and the receiving filter 12 may each have any configuration that allows the passage of RF signals in a predetermined frequency band, such as transmission or reception signals.

A transmission signal passed through the transmitting filter 11 and inputted to the third port "c" is outputted from the first port "a" to the common terminal ANTb by the circulator 13 (antenna duplexer), and a reception signal inputted through the common terminal ANTb to the first port "a" is outputted from the second port "b" to the receiving filter 12 by the circulator 13.

(2) Stack Structure

A stack structure of the composite component 10 will be described. As illustrated in FIG. 1, the composite component 10 includes a first substrate 14, columnar spacer members 15 disposed on an upper surface 14a (principal surface) of the first substrate 14, a second substrate 16 disposed on the spacer members 15 and spaced from the first substrate 14 in the up-and-down direction in FIG. 1, and metal conductors 17 included in the respective spacer members 15 and configured to electrically connect the first substrate 14 to the second substrate 16.

The composite component 10 includes a plurality of components 18 mounted on the upper surface 14a of the first substrate 14, and a plurality of components 19 mounted on a lower surface 16b (principal surface) of the second substrate 16. The components 18 and 19 are disposed in an internal space S between the first substrate 14 and the second substrate 16. Thus, in the composite component 10, the components 18 and 19 can be arranged not only in the planar direction but also in the up-and-down direction. Therefore, it is possible to increase the density of components in the composite component 10, and to reduce the module size of the composite component 10 in a plan view. The components 18 and 19 may be encapsulated in a typical molding resin, such as an epoxy resin, filled in the space between the first substrate 14 and the second substrate 16.

In the present embodiment, like the module substrate 2, the first substrate 14 is formed by a ceramic multilayer body obtained by stacking and firing a plurality of dielectric layers formed by ceramic green sheets. Also as in the case of the module substrate 2, a wiring electrode 20 and a first ground electrode 21 are formed in the first substrate 14 by appropriately forming via conductors and in-plane conductive patterns for each dielectric layer. Mounting electrodes (not shown) for mounting the components 18 thereon are formed on the upper surface 14a of the first substrate 14, and a plurality of external connection terminals 22 are formed on a lower surface 14b of the first substrate 14. The second substrate 16 is formed in the same manner as the first substrate 14. As in the case of the first substrate 14, a wiring electrode 23 and a second ground electrode 24 are formed in the second substrate 16, and mounting electrodes (not shown) for mounting the components 19 thereon are formed on the lower surface 16b of the second substrate 16.

The first ground electrode 21 is disposed on a predetermined dielectric layer of the first substrate 14. The first ground electrode 21 is formed in a planar shape over the entire surface, except the edge, of the dielectric layer to overlap all the components 18 in a plan view. The second ground electrode 24 is disposed on a dielectric layer adjacent to an upper surface 16a of the second substrate 16. The second ground electrode 24 is formed in a planar shape over the entire surface, except the edge, of the dielectric layer to overlap all the components 19 in a plan view. The second ground electrode 24 may be formed on the upper surface 16a of the second substrate 16.

The first substrate 14 and the second substrate 16 may each be formed by a multi-layer substrate or a single-layer substrate using a resin, ceramic, or polymer material, such as a printed circuit board, an LTCC substrate, an alumina substrate, or a composite substrate. The first substrate 14 and the second substrate 16 may each be formed by appropriately selecting the most suitable material for the intended use of the composite component 10.

The spacer members 15 are each a component for electrically connecting the first substrate 14 to the second substrate 16. In the present embodiment, the spacer members 15 are formed of an insulating material, such as ceramic or resin, in a columnar shape. In the present embodiment, the spacer members 15 each have a through hole passing therethrough in the up-and-down direction, and the metal conductor 17 is disposed in the through hole. The metal conductors 17 are formed of a metal material having high thermal conductivity and high electrical conductivity, such as Au, Ag, Cu, Pt, or Ni. The spacer members 15 may each be formed by a metal column functioning as the metal conductor 17. The spacer members 15 may be formed by various components, each having outer electrodes functioning as the metal conductors 17 on the upper and lower surfaces thereof. In this case, the outer electrodes on the upper and lower surfaces of each of the various components are electrically connected by an outer electrode on the side surface and an inner electrode of the component. The components 18 and 19 (the transmitting filter 11, the receiving filter 12, the circulator 13, etc.) may be disposed in the internal space S surrounded by the first substrate 14, the second substrate 16, and the spacer members 15 by arranging the spacer members 15 at the edge of the first substrate 14 and second substrate 16 to surround the center portions of the respective principal surfaces of the first and second substrates 14 and 16.

The components 18 and 19 are components for forming the transmitting filter 11, the receiving filter 12, and the circulator 13. That is, a component including a filter circuit, a component including an acoustic wave resonator, a component including circuit devices such as an inductor and a capacitor, and a component including a circulator circuit are appropriately selected and mounted as the components 18 and 19 on the substrates 14 and 16 by a bonding material, such as the solder H.

In the present embodiment, the transmission path SL1, the reception path SL2, and the common path SL3 are formed by the wiring electrodes 20 and 24 and the metal conductors 17. The transmitting terminal Txb, the receiving terminal Rxb, the common terminal ANTb, and the ground terminal are formed by the external connection terminals 22.

In the present embodiment, the components 18 on the upper surface 14a of the first substrate 14 include at least a first component forming the resonant circuit 11a of the transmitting filter 11. All the circuit elements, such as the transmitting filter 11 and the matching circuit, in the transmission path SL1 are disposed in or on the first substrate 14. Similarly, in the present embodiment, the components 19 on the lower surface 16b of the second substrate 16 include at least a second component forming the resonant circuit 12a of the receiving filter 12. All the circuit elements, such as the receiving filter 12 and the matching circuit, in the reception path SL2 are disposed in or on the second substrate 16. Also, in the present embodiment, the components 18 on the upper surface 14a of the first substrate 14 include a component forming the circulator 13.

The resonant circuit 11a may be formed only by the component 18, or part of the resonant circuit 11a may be formed by the component 18 and the remaining part of the resonant circuit 11a may be formed by circuit devices, such as a capacitor and an inductor, formed by the wiring electrode 20. The resonant circuit 11a may be formed only by circuit devices, such as a capacitor and an inductor, formed by the wiring electrode 20. The transmitting filter 11 may be formed only by the component 18, or part of the transmitting filter 11 may be formed by the component 18 and the remaining part of the transmitting filter 11 may be formed by circuit devices, such as a capacitor and an inductor, formed by the wiring electrode 20. The transmitting filter 11 may be formed only by circuit devices, such as a capacitor and an inductor, formed by the wiring electrode 20.

Like the resonant circuit 11a, the resonant circuit 12a may be formed only by the component 19, or part of the resonant circuit 12a may be formed by the component 19 and the remaining part of the resonant circuit 12a may be formed by circuit devices, such as a capacitor and an inductor, formed by the wiring electrode 20. The resonant circuit 12a may be formed only by circuit devices, such as a capacitor and an inductor, formed by the wiring electrode 20. Like the transmitting filter 11, the receiving filter 12 may be formed only by the component 19, or part of the receiving filter 12 may be formed by the component 19 and the remaining part of the receiving filter 12 may be formed by circuit devices, such as a capacitor and an inductor, formed by the wiring electrode 23. The receiving filter 12 may be formed only by circuit devices, such as a capacitor and an inductor, formed by the wiring electrode 23.

(3) Resonant Circuit

The resonant circuit 11a included in the transmitting filter 11 and the resonant circuit 12a included in the receiving filter 12 will be described.

(3-1) Configuration of Resonant Circuit

Figure 3A:
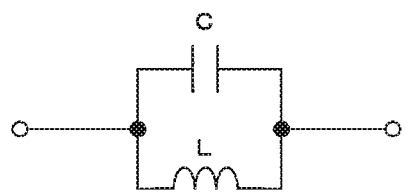
FIGS. 3A to 3F each illustrate a different resonant circuit included in a transmitting filter or a receiving filter.
Figure 3B:
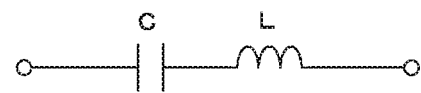
Figure 3C:
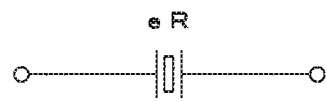

Exemplary configurations of the resonant circuits 11a and 12a will be described with reference to FIGS. 3A to 3F. A resonant circuit illustrated in FIG. 3A is an LC parallel resonant circuit in which a capacitor C and an inductor L are connected in parallel, and a resonant circuit illustrated in FIG. 3B is an LC series resonant circuit in which the capacitor C and the inductor L are connected in series. A resonant circuit illustrated in FIG. 3C is a resonant circuit formed by an acoustic wave resonator eR.

Figure 3D:
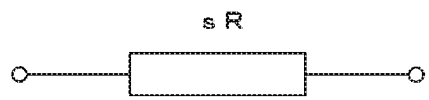
Figure 3E:
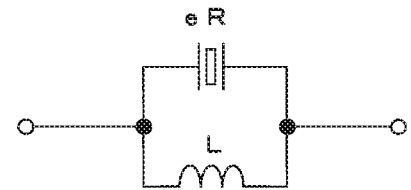
Figure 3F:
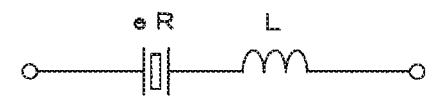

A resonant circuit illustrated in FIG. 3D is a resonant circuit formed by a $\lambda/2$ resonator sR. As illustrated in FIG. 3E, a resonant circuit may be formed by replacing the capacitor C in the LC parallel resonant circuit with the acoustic wave resonator eR, or as illustrated in FIG. 3F, a resonant circuit may be formed by replacing the capacitor C in the LC series resonant circuit with the acoustic wave resonator eR.

The configuration of the resonant circuits 11a and 12a is not limited to those illustrated in FIGS. 3A to 3F. The resonant circuits 11a and 12a may each be formed by appropriately selecting and adding some of the circuit devices, such as the capacitor C, the inductor L, the acoustic wave resonator eR, and the λ/2 resonator sR, to each of the resonant circuits illustrated in FIGS. 3A to 3F. The resonant circuits 11a and 12a may each be formed by appropriately combining some of the resonant circuits illustrated in FIGS. 3A to 3F.

(3-2) Variable Reactance Circuit

A variable reactance circuit will be described.

In the present embodiment, at least part of each of the resonant circuits 11a and 12a is formed by a variable reactance circuit as necessary. Specifically, the capacitor C forming each of the resonant circuits 11a and 12a is replaced with a variable reactance circuit appropriately selected from variable reactance circuits 30 to 34 illustrated in FIGS. 4A to 4E, as necessary, to form the resonant circuits 11a and 12a. Similarly, the inductor L forming each of the resonant circuits 11a and 12a is replaced with a variable reactance circuit appropriately selected from variable reactance circuits 35 and 36 illustrated in FIGS. 5A and 5B, as necessary, to form the resonant circuits 11a and 12a.

When at least part of each of the resonant circuits 11a and 12a is formed by one of the variable reactance circuits 30 to 36 as necessary, the transmitting filter 11 and the receiving filter 12 can accommodate a plurality of predetermined transmission frequency bands and predetermined reception frequency bands by varying the resonance characteristics of the resonant circuits 11a and 12a using the one of the variable reactance circuits 30 to 36. This eliminates the need for preparing the transmitting filter 11 and the receiving filter 12 for each frequency band. It is thus possible to form the composite component 10 (front-end module 1) that can accommodate different transmission frequency bands and reception frequency bands with fewer components, and to reduce the size of the composite component 10 (front-end module 1).

In the present embodiment, the variable reactance circuits 30 to 36 are each formed in the first component (component 18) forming at least part of the resonant circuit 11a or in the second component (component 19) forming at least part of the resonant circuit 12a. That is, the resonant circuits 11a and 12a are formed by appropriately selecting the components 18 and 19, each including any of the variable reactance circuits 30 to 36, and mounting the selected ones on the first substrate 14 or the second substrate 16.

Exemplary configurations of a variable reactance circuit that varies the capacitive reactance will be described with reference to FIGS. 4A to 4E. Note that outer electrodes P1, P2, P3, and P4 described below are each an outer electrode formed in each of the components 18 and 19 in accordance with the configuration of the variable reactance circuit included in the corresponding one of the components 18 and 19.

Figure 4A:
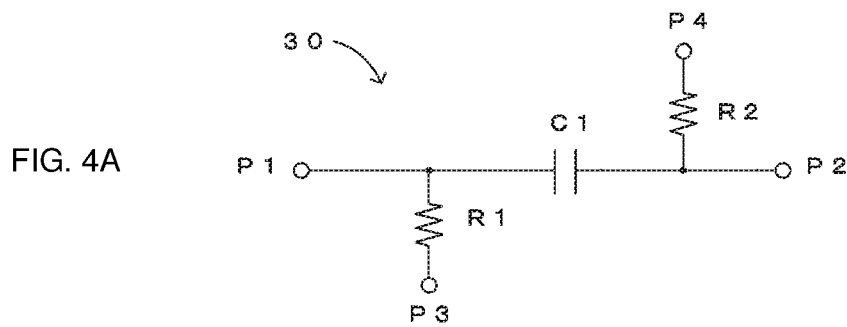
FIGS. 4A to 4E each illustrate a different variable reactance circuit that varies the capacitive reactance.

The variable reactance circuit 30 illustrated in FIG. 4A includes a variable capacitance capacitor C1 having dielectric layers made of a dielectric material, such as (Ba,Sr)TiO$_3$, BaTiO$_3$, SrTiO$_3$, or PbTiO$_3$. By regulating the voltage between the third and fourth outer electrodes P3 and P4 to arbitrarily adjust the voltage applied through first and second resistors R1 and R2 to both ends of the capacitor C1, the capacitance of the capacitor C1 measured at the first and second outer electrodes P1 and P2 can be varied.

Figure 4B:
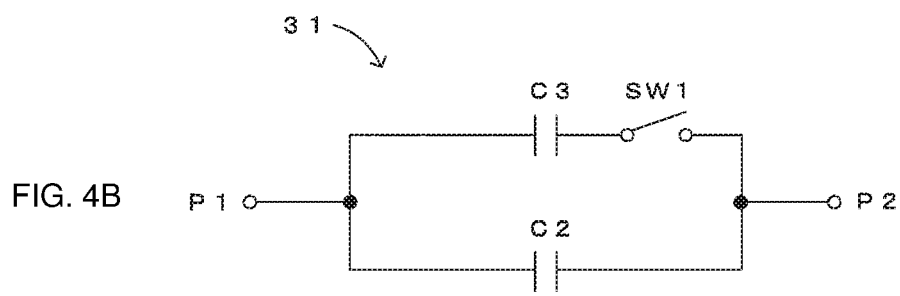
Figure 4C:
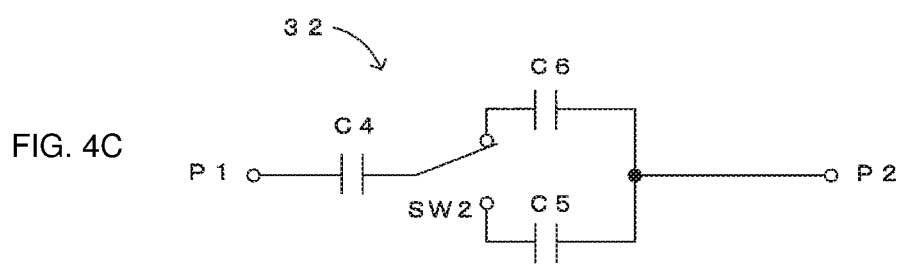

In the variable reactance circuit 31 illustrated in FIG. 4B, turning on and off a switch SW1 can switch the connection between capacitors C2 and C3 and vary the capacitance between the first and second outer electrodes P1 and P2. In the variable reactance circuit 32 illustrated in FIG. 4C, switching the connection of a switch SW2 can switch the connection between capacitors C4, C5, and C6 and vary the capacitance between the first and second outer electrodes P1 and P2.

Figure 4D:
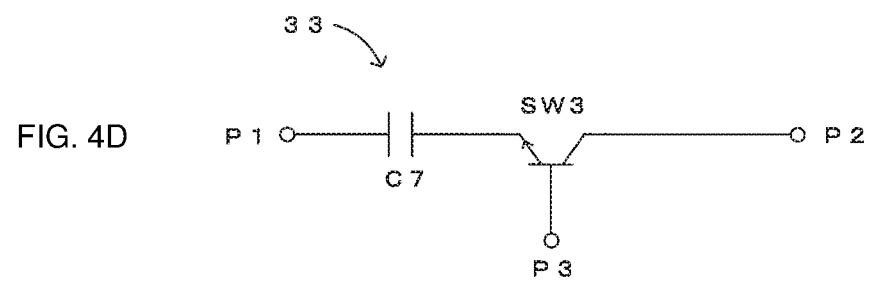

In the variable reactance circuit 33 illustrated in FIG. 4D, by turning off a switch SW3 on the basis of a control signal inputted to the third outer electrode P3 (base), the entire capacitance including that of a capacitor C7 is changed depending on the off-capacitance of a bipolar transistor. It is thus possible to vary the capacitance between the first and second outer electrodes P1 and P2.

Figure 4E:
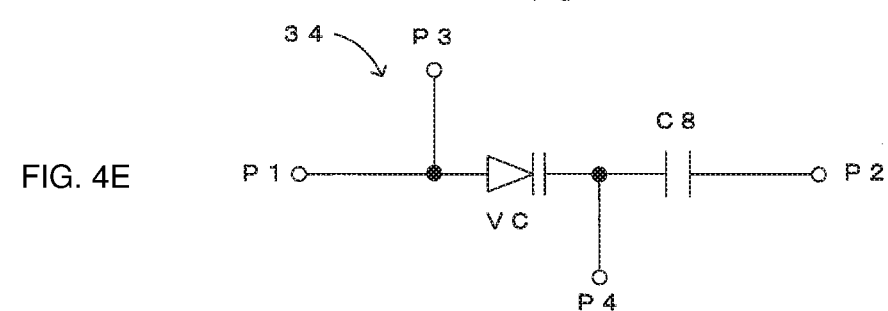

In the variable reactance circuit 34 illustrated in FIG. 4E, by regulating the voltage between the third and fourth outer electrodes P3 and P4 to vary a bias voltage applied to a variable capacitance diode VC, the capacitance of the variable capacitance diode VC is switched and the entire capacitance including that of a capacitor C8 is changed. It is thus possible to vary the capacitor capacitance between the first and second outer electrodes P1 and P2.

Exemplary configurations of a variable reactance circuit that varies the inductive reactance will be described with reference to FIGS. 5A and 5B.

In the variable reactance circuit 35 illustrated in FIG. 5A, turning on and off a switch SW4 can switch the connection between inductors L2 and L3 and vary the inductance between the first and second outer electrodes P1 and P2. In the variable reactance circuit 36 illustrated in FIG. 5B, switching the connection of a switch SW5 can switch the connection between inductors L3, L4, and L5 and vary the inductance between the first and second outer electrodes P1 and P2.

The configuration of the variable reactance circuit is not limited to those illustrated in FIGS. 4A to 4E and FIGS. 5A and 5B, and more capacitors and inductors may be added to each variable reactance circuit to form another variable reactance circuit. The variable reactance circuits illustrated in FIGS. 4A to 4E and FIGS. 5A and 5B may be appropriately combined to form another variable reactance circuit. A resonant circuit may be integrally formed in the components 18 and 19 each having a variable reactance circuit, or a filter including a resonant circuit may be integrally formed in the components 18 and 19 each having a variable reactance circuit.

As described above, in the present embodiment, the resonant circuit 11a of the transmitting filter 11 that generates a large amount of heat due to the passage of a transmission signal is disposed in or on the first substrate 14 having a plurality of external connection terminals 22 on the lower surface 14b. Therefore, as indicated by arrows in FIG. 6, the heat generated in the resonant circuit 11a is efficiently dissipated through the plurality of external connection terminals 22 on the first substrate 14 to the module substrate 2. Since this prevents an excessive rise in the temperature of the resonant circuit 11a, it is possible to reduce the changes in the resonant frequency of the resonant circuit 11a from a desired value. Also, since the heat generated in the resonant circuit 11a is efficiently dissipated to the outside of the composite component 10, it is possible to prevent a temperature rise in the receiving filter (resonant circuit 12a)

caused by the heat generated in the resonant circuit 11a, and thus to reduce the degradation in the characteristics of the receiving filter 12. Therefore, by improving the heat dissipation characteristics of the composite component 10 having a stack structure, it is possible to reduce the degradation in the characteristics of the transmitting filter 11 and the receiving filter 12, and to reduce the degradation in the reliability of the composite component 10. The composite component 10 which is compact, high-performance, and highly reliable can thus be provided.

Even when the component 18 (first component) forming at least part of the resonant circuit 11a is disposed on the upper surface 14a of the first substrate 14, the heat generated in the component 18 can be efficiently dissipated through the plurality of external connection terminals 22 on the first substrate 14 to the outside of the composite component 10. Heat tends to be trapped when the components 18 and 19 are encapsulated in a typical molding resin, such as an epoxy resin, filled in the space between the first substrate 14 and the second substrate 16. With the configuration of the present embodiment described above, it is possible to improve the heat dissipation characteristics and thus to efficiently dissipate the heat to the outside. Therefore, when the components 18 and 19 are encapsulated in resin, the configuration described above can achieve particularly significant improvement in heat dissipation characteristics.

Of the circuit elements, such as the transmitting filter 11 (resonant circuit 11a) and the matching circuit, disposed in the transmission path SL1 through which a high-power transmission signal whose signal level is amplified by the power amplifier 3 passes, the resonant circuit 11a is most likely to generate heat. When at least the resonant circuit 11a is disposed in or on the first substrate 14, a temperature rise in the composite component 10 can be effectively suppressed. In the present embodiment, since all the circuit elements, such as the transmitting filter 11 and the matching circuit, in the transmission path SL1 are disposed in or on the first substrate 14, the heat generated in each of the circuit elements disposed in the transmission path SL1 can be effectively dissipated to the outside of the composite component 10. It is thus possible to further effectively suppress a temperature rise in the composite component 10, and to further effectively reduce the degradation in the characteristics of the transmitting filter 11 and the receiving filter 12.

The component 19 (second component) forming at least part of the receiving filter 12 is disposed not on the first substrate 14 having the resonant circuit 11a which may generate the highest heat, but on the lower surface 16b of the second substrate 16 distant from the resonant circuit 11a. Therefore, since a temperature rise in the component 19 caused by the conduction or radiation of the heat generated in the resonant circuit 11a can be suppressed, a temperature rise in the receiving filter 12 can be prevented. It is thus possible to further effectively reduce the degradation in the characteristics of the receiving filter 12.

Of the circuit elements, such as the receiving filter 12 (resonant circuit 12a) and the matching circuit, disposed in the reception path SL2, the receiving filter 12 is likely to be most significantly changed in characteristics by a temperature rise. When at least the component 19 forming at least part of the receiving filter 12 is disposed on the second substrate 16, it is possible to reduce the degradation in the characteristics of the receiving filter 12, and to reduce the degradation in the reliability of the receiving filter 12. In the present embodiment, since all the circuit elements, such as the receiving filter 12 and the matching circuit, in the reception path SL2 are disposed in or on the second substrate 16, a rise in the temperature of each of the circuit elements disposed in the reception path SL2 can be effectively suppressed. Therefore, it is possible to further effectively reduce the degradation in the characteristics of the receiving filter 12, and reduce the degradation in the reliability of the receiving filter 12.

As indicated by arrows in FIG. 6, part of the heat generated in the circuit elements, including the resonant circuit 11a, in or on the first substrate 14 are efficiently transmitted to the second substrate 16 through the metal conductors 17 (spacer members 15) having high thermal conductivity. The plurality of components 18 and 19 are disposed between the first substrate 14 and the second substrate 16, and the upper surface 16a of the second substrate 16 has no components 18 and 19 thereon. The heat transmitted to the second substrate 16 can thus be efficiently dissipated to the outside from the entire upper surface 16a of the second substrate 16. Therefore, it is possible to further effectively suppress a temperature rise in the resonant circuits 11a and 12a and the composite component 10.

Since the first substrate 14 and the second substrate 16 are electrically connected by the metal conductors 17 having high electrical conductivity, an electrical loss during the transmission of the signals between the first substrate 14 and the second substrate 16 can be reduced. The composite component 10 with no significant insertion loss can thus be provided.

The heat generated in the circuit elements, including the resonant circuit 11a, in the first substrate 14 can be further efficiently dissipated to the outside of the composite component 10 through the first ground electrode 21 formed in a planar shape to overlap substantially the entire surface of the first substrate 14 in a plan view and the plurality of external connection terminals 22. It is thus possible to further effectively reduce the degradation in the characteristics of the transmitting filter 11 and the receiving filter 12.

Although the external connection terminals 22 formed on the lower surface 14b of the first substrate 14 are electrically connected to the external module substrate 2, the external connection terminals 22 include a ground terminal connected to the ground path. In the transmitting filter 11, electromagnetic waves greater than those in the receiving filter 12 may be generated because a transmission signal having a signal level higher than that of a reception signal is inputted to the transmitting filter 11. When the transmitting filter 11 is disposed in or on the first substrate 14 close to the ground path, the influence of electromagnetic waves generated in the transmitting filter 11 can be reduced. When the transmitting filter 11 is disposed at a position close to the first ground electrode 21, the influence of electromagnetic waves generated from the resonant circuit or the like included in the transmitting filter 11 can be further effectively reduced.

The heat transmitted from the first substrate 14 to the second substrate 16 can be further efficiently dissipated from the upper surface 16a of the second substrate 16 to the outside, through the second ground electrode 24 formed in a planar shape to overlap substantially the entire surface of the second substrate 16 in a plan view. It is thus possible to further effectively reduce the degradation in the characteristics of the transmitting filter 11 and the receiving filter 12.

Since electromagnetic waves from the outside are blocked by the first ground electrode 21 and the second ground electrode 24, it is possible to reduce the degradation in the characteristics of the composite component 10 and instability in the operation of the composite component 10. Also, since the first ground electrode 21 and the second ground electrode 24 prevent the electromagnetic waves generated in the composite component 10 from being radiated to the outside, the influence of the electromagnetic waves on various components disposed outside the composite component 10 can be reduced. It is thus possible to reduce the degradation in the characteristics of an electronic device, such as a mobile communication terminal, having the composite component 10 mounted thereon, and to reduce the instability in the operation of the electronic device.

When the resonant circuits 11a and 12a are each formed using any of the variable reactance circuits 30 to 36, the resonant circuits 11a and 12a tend to be affected by heat generation because the variable reactance circuits 30 to 36 each typically include such a component as a switch. In this case, the resonant frequencies of the resonant circuits 11a and 12a may vary, and this may cause insertion loss and instability in characteristics, such as attenuation characteristics, of the transmitting filter 11 and the receiving filter 12. However, in the present embodiment, the heat generated in the resonant circuits 11a and 12a each including any of the variable reactance circuits 30 to 36 can be efficiently dissipated to the outside of the composite component 10 as indicated by arrows in FIG. 6. It is thus possible not only to reduce the degradation in the characteristics of the transmitting filter 11 and the receiving filter 12, but also to provide the high-performance and highly reliable composite component 10 which is capable of accommodating the transmission and reception signals in a plurality of frequency bands.

Since the component 18 forming the circulator 13 is disposed on the first substrate 14, the heat generated in the circulator 13 by the passage of a transmission signal can be efficiently dissipated to the outside through the plurality of external connection terminals 22 on the first substrate 14. It is thus possible to suppress an excessive rise in the temperature of the composite component 10 caused by the heat generated in the circulator 13.

Since the power amplifier 3 that generates heat is disposed outside the stack structure of the composite component 10, a rise in the temperature of the composite component 10 caused by heat of the power amplifier 3 can be suppressed. Even when the composite component 10 is heated by heat radiated from the power amplifier 3 or by heat conducted through the transmission path SL1, the degradation in the characteristics of the transmitting filter 11 and the receiving filter 12 can be reduced by improving the heat dissipation characteristics of the composite component 10 having a stack structure. The front-end module 1 of high reliability can thus be provided, which can reduce the degradation in characteristics.

Second Embodiment

Figure 7:
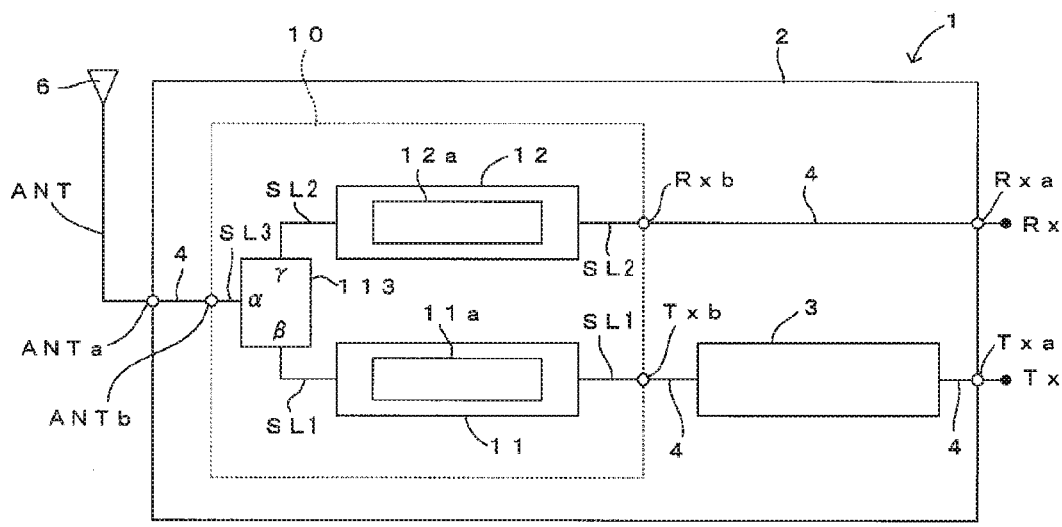
FIG. 7 is a circuit block diagram illustrating an electrical configuration of a front-end module according to a second embodiment of the present disclosure.

A second embodiment of the present disclosure will now be described with reference to FIG. 7. FIG. 7 is a circuit block diagram illustrating an electrical configuration of a front-end module according to the second embodiment of the present disclosure.

The present embodiment differs from the first embodiment in that the first substrate 14 has a switch IC 113 as an antenna duplexer, as illustrated in FIG. 7. In the present embodiment, the switch IC 113 is mounted on the upper surface 14a of the first substrate 14 as the component 18. The other elements are the same as those of the first embodiment, and their description is omitted by using the same reference numerals.

The switch IC 113 includes a common terminal α connected to the common terminal ANTb, and at least two signal terminals. The switch IC 113 connects the common terminal to one of a plurality of signal terminals. In the present embodiment, the output side of the transmitting filter 11 is connected to a first signal terminal β and the input side of the receiving filter 12 is connected to a second signal terminal γ. By switching the connection between the common terminal α and the first and second signal terminals β and γ, the switch IC 113 outputs a transmission signal passed through the transmitting filter 11 to the common terminal ANTb, and outputs a reception signal inputted to the common terminal ANTb to the receiving filter 12.

With this configuration, since the switch IC 113 (component 18) is disposed on the first substrate 14 as in the first embodiment described above, the heat generated in the switch IC 113 by the passage of a transmission signal can be efficiently dissipated to the outside through the plurality of external connection terminals 22 on the first substrate 14. It is thus possible to suppress an excessive rise in the temperature of the composite component 10 caused by the heat generated in the switch IC 113.

Third Embodiment

Figure 8:
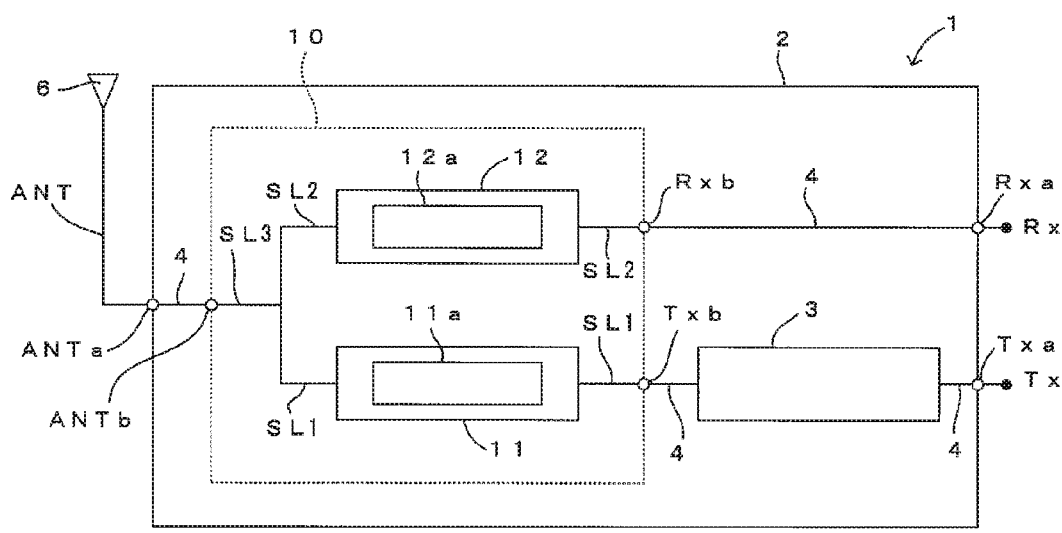
FIG. 8 is a circuit block diagram illustrating an electrical configuration of a front-end module according to a third embodiment of the present disclosure.

A third embodiment of the present disclosure will now be described with reference to FIG. 8. FIG. 8 is a circuit block diagram illustrating an electrical configuration of a front-end module according to the third embodiment of the present disclosure.

The present embodiment differs from the first embodiment in that, as illustrated in FIG. 8, the composite component 10 does not include any element equivalent to an antenna duplexer, and is configured as a so-called duplexer. The other elements are the same as those of the first embodiment, and their description is omitted by using the same reference numerals.

With this configuration, as in the first embodiment described above, it is still possible to reduce the degradation in the characteristics of the transmitting filter 11 and the receiving filter 12, reduce the degradation in the reliability of the composite component 10, and provide the composite component 10 which is compact, high-performance, and highly reliable.

Fourth Embodiment

Figure 9:
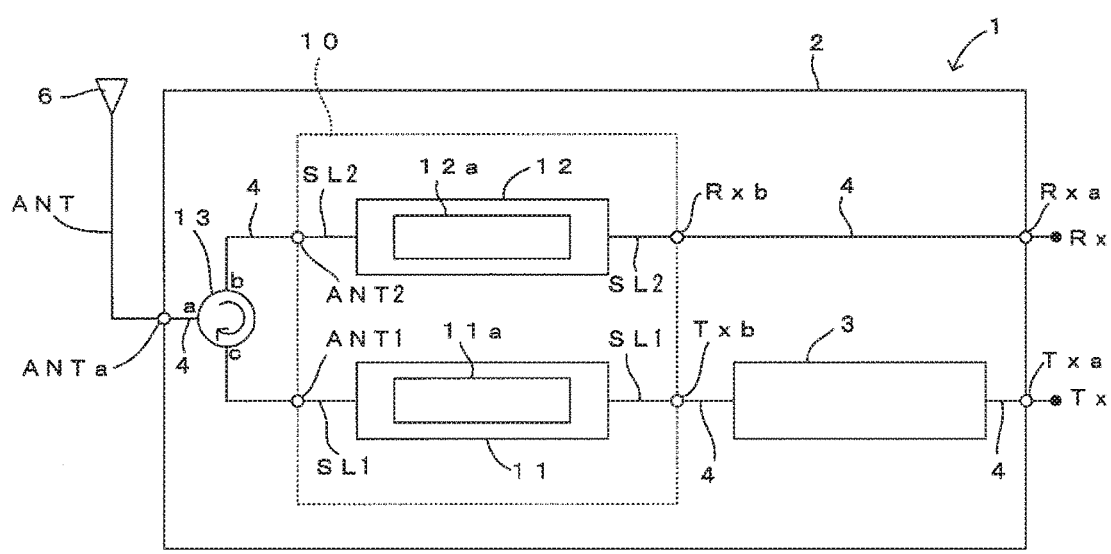
FIG. 9 is a circuit block diagram illustrating an electrical configuration of a front-end module according to a fourth embodiment of the present disclosure.

A fourth embodiment of the present disclosure will now be described with reference to FIG. 9. FIG. 9 is a circuit block diagram illustrating an electrical configuration of a front-end module according to the fourth embodiment of the present disclosure.

The present embodiment differs from the first embodiment in that the module substrate 2 has the circulator 13 as illustrated in FIG. 9. Additionally, the composite component 10 includes a first antenna-side terminal ANT1 connected to the output side of the transmitting filter 11, and a second antenna-side terminal ANT2 connected to the input side of the receiving filter 12. The first antenna-side terminal ANT1 is connected to the third port "c" of the circulator 13, and the second antenna-side terminal ANT2 is connected to the second port "b" of the circulator 13. The first and second antenna-side terminals ANT1 and ANT2 are formed by respective external connection terminals 22 on the lower surface 14b of the first substrate 14. The other elements are the same as those of the first embodiment, and their description is omitted by using the same reference numerals.

With this configuration, as in the first embodiment described above, it is still possible to reduce the degradation in the characteristics of the transmitting filter 11 and the receiving filter 12, reduce the degradation in the reliability of the composite component 10, and provide the composite component 10 which is compact, high-performance, and highly reliable.

Fifth Embodiment

Figures 10A, 10B:
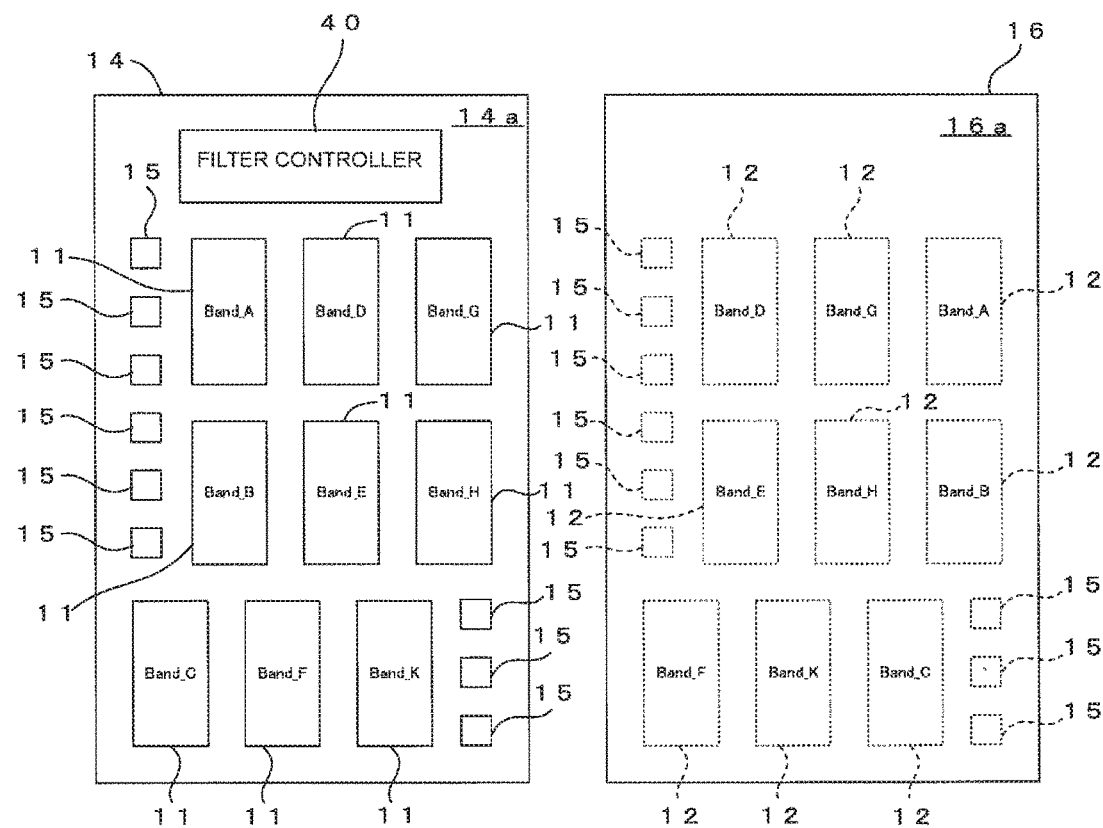
FIG. 10A is a top view of a first substrate.
FIG. 10B is a top view of a second substrate and illustrates an arrangement of filters on a lower surface of the second substrate.
Figure 10C:
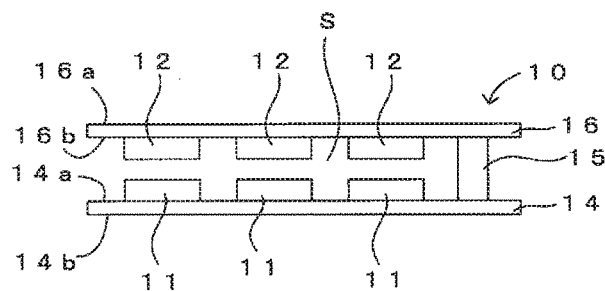
FIG. 10C is a lateral view of the composite component as seen from the lower side of FIGS. 10A and 10B.
Figure 11:
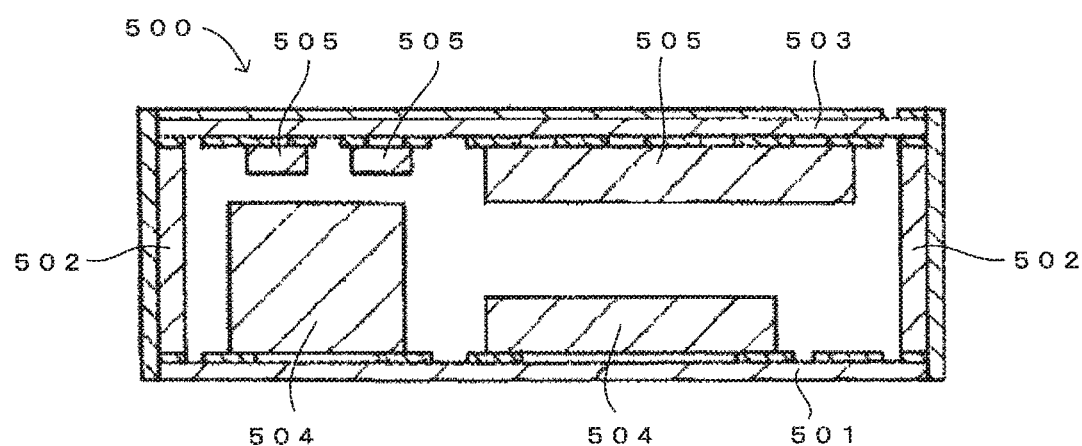
FIG. 11 illustrates a conventional composite component having a stack structure.

A fifth embodiment of the present disclosure will now be described with reference to FIGS. 10A to 10C. Each of FIGS. 10A to 10C illustrates a composite component according to the fifth embodiment of the present disclosure. FIG. 10A is a top view of the first substrate, FIG. 10B is a top view of the second substrate and illustrates an arrangement of filters on the lower surface of the second substrate, and FIG. 10C is a lateral view of the composite component as seen from the lower side of FIGS. 10A and 10B.

The present embodiment differs from the first embodiment in that, as illustrated in FIGS. 10A to 10C, a plurality of (nine, in the example illustrated in FIG. 10A) transmitting filters 11 (first substrate-side filters) having different pass bands (Band_A, Band_B, Band_C, Band_D, Band_E, Band_F, Band_G, Band_H, and Band_K) are arranged on the upper surface 14*a* of the first substrate 14, and a plurality of (nine, in the example illustrated in FIG. 10B) receiving filters 12 (second substrate-side filters) having different pass bands (Band_A, Band_B, Band_C, Band_D, Band_E, Band_F, Band_G, Band_H, and Band_K) are arranged on the lower surface 16*b* of the second substrate 16. Additionally, a filter controller 40 configured to control the operation of each of the plurality of transmitting filters 11 and the operation of each of the plurality of receiving filters 12 is disposed on the upper surface 14*a* of the first substrate 14. The other elements are the same as those of the first embodiment, and their description is omitted by using the same reference numerals.

As illustrated in FIGS. 10A to 10C, of the plurality of transmitting filters 11 and plurality of receiving filters 12, the corresponding transmitting and receiving filters 11 and 12 arranged to coincide with each other in a plan view have pass bands that are set in different frequency bands. Specifically, the transmitting filter 11 with a pass band of Band_A and the receiving filter 12 with a pass band of Band_D are arranged to coincide with each other in a plan view, the transmitting filter 11 with a pass band of Band_B and the receiving filter 12 with a pass band of Band_E are arranged to coincide with each other in a plan view, the transmitting filter 11 with a pass band of Band_C and the receiving filter 12 with a pass band of Band_F are arranged to coincide with each other in a plan view, the transmitting filter 11 with a pass band of Band_D and the receiving filter 12 with a pass band of Band_G are arranged to coincide with each other in a plan view, and the transmitting filter 11 with a pass band of Band_E and the receiving filter 12 with a pass band of Band_H are arranged to coincide with each other in a plan view.

The transmitting filter 11 with a pass band of Band_F and the receiving filter 12 with a pass band of Band_K are arranged to coincide with each other in a plan view, the transmitting filter 11 with a pass band of Band_G and the receiving filter 12 with a pass band of Band_A are arranged to coincide with each other in a plan view, the transmitting filter 11 with a pass band of Band_H and the receiving filter 12 with a pass band of Band_B are arranged to coincide with each other in a plan view, and the transmitting filter 11 with a pass band of Band_K and the receiving filter 12 with a pass band of Band_C are arranged to coincide with each other in a plan view.

The filter controller 40 is mounted as the component 18 on the upper surface 14*a* of the first substrate 14. The filter controller 40 controls each of the transmitting filters 11 and each of the receiving filters 12 such that of the plurality of transmitting filters 11 and plurality of receiving filters 12, the corresponding transmitting and receiving filters 11 and 12 arranged to coincide with each other in a plan view, as described above, do not operate simultaneously.

With this configuration, the influence of signals passing through one of the corresponding transmitting and receiving filters 11 and 12 arranged to coincide with each other in a plan view on the other filter can be suppressed. One of the corresponding transmitting and receiving filters 11 and 12 arranged to coincide with each other in a plan view does not operate while the other filter is operating. It is thus possible to reduce the degradation in filter characteristics caused by interaction between electromagnetic waves that are generated, by the simultaneous operation, from the inductor, the capacitor, and the resonator forming each of the filters 11 and 12. By mounting the composite component 10 configured as described above, the front-end module 1 which is compact and high-performance can be provided.

The present disclosure is not limited to the embodiments described above. Various changes other than those described above can be made and any combinations of configurations of the embodiments are possible without departing from the scope of the present disclosure. For example, the composite component 10 may include other circuit elements. The power amplifier 3 may be mounted on the composite component 10, or an isolator may be added to the output side of the transmitting filter 11. The front-end module 1 may include a plurality of module substrates, and the composite component 10 and the power amplifier 3 may be mounted on different module substrates.

Although the embodiments described above deal with the front-end module 1 formed by mounting one composite component 10 on the module substrate 2, a front-end module may be formed by mounting two or more composite components 10 on the module substrate 2. In this case, a switch IC may be mounted on the module substrate 2, so that the switch IC selects a composite component 10 to be used from the plurality of composite components 10 on the module substrate 2 and connects the selected composite component 10 to the common electrode ANTa.

The components for the transmitting filter 11, such as the inductor, the capacitor, and the resonator forming the transmitting filter 11, and the components for the receiving filter 12, such as the inductor, the capacitor, and the resonator forming the receiving filter 12, are preferably arranged such that none of them overlap in a plan view. However, it is only necessary that the above-described components be arranged such that at least some of the components for the transmitting filter 11 and at least some of the components for the receiving filter 12 do not overlap in a plan view.

The present disclosure is widely applicable not only to composite components including a transmitting filter and a receiving filter, but also to front-end modules including such a composite component.

1: front-end module
2: module substrate (mounting substrate)
3: power amplifier
10: composite component
11: transmitting filter (first substrate-side filter)
11*a*: resonant circuit 12: receiving filter (second substrate-side filter)
14: first substrate
14a: upper surface (principal surface)
15: spacer member
16: second substrate
16b: lower surface (principal surface)
17: metal conductor
21: first ground electrode
24: second ground electrode
30 to 36: variable reactance circuit
40: filter controller
S: internal space

The invention claimed is:

1. A composite component adapted for being disposed on a mounting substrate, the composite component comprising:
a transmitting filter;
a first substrate adapted for being disposed adjacent to the mounting substrate and electrically connected to the mounting substrate;
a second substrate disposed opposite to the first substrate;
a spacer member interposed between the first substrate and the second substrate to support the first substrate and the second substrate, the spacer member being configured to electrically connect the first substrate to the second substrate,
wherein the second substrate is adapted for being electrically connected to the mounting substrate through a second spacer member; and
the transmitting filter is disposed in an internal space and on a principal surface of the first substrate, the internal space being surrounded by the first substrate and the second substrate.

2. The composite component according to claim 1, wherein the transmitting filter includes a resonant circuit; and
the resonant circuit is disposed in the internal space and on the principal surface of the first substrate.

3. The composite component according to claim 1, further comprising a receiving filter,
wherein the receiving filter is disposed in the internal space and on the principal surface of the second substrate.

4. The composite component according to claim 1, wherein the spacer member is a metal conductor.

5. The composite component according to claim 1, further comprising:
a plurality of first substrate-side filters arranged on an upper surface of the first substrate; and
a plurality of second substrate-side filters arranged on a lower surface of the second substrate,
wherein, of the plurality of first and second substrate-side filters, the corresponding first and second substrate-side filters arranged to coincide with each other in a plan view have respective pass bands set in different frequency bands.

6. The composite component according to claim 1, further comprising:
a plurality of first substrate-side filters arranged on an upper surface of the first substrate;
a plurality of second substrate-side filters arranged on a lower surface of the second substrate; and
a filter controller configured to control an operation of each of the plurality of first substrate-side filters and an operation of each of the plurality of second substrate-side filters,
wherein the filter controller performs the control such that of the plurality of first and second substrate-side filters, the corresponding first and second substrate-side filters arranged to coincide with each other in a plan view do not operate simultaneously.

7. The composite component according to claim 5, wherein the plurality of first substrate-side filters each are the transmitting filter, and the plurality of second substrate-side filters each are a receiving filter.

8. The composite component according to claim 1, wherein the first substrate includes a first ground electrode formed in a planar shape to overlap with all components on the first substrate in a plan view.

9. The composite component according to claim 1, wherein the second substrate includes, at a position adjacent to an upper surface thereof, a second ground electrode formed in a planar shape to overlap with all components on the second substrate in a plan view.

10. The composite component according to claim 2, wherein the resonant circuit includes a variable reactance circuit; and
the variable reactance circuit is disposed in the internal space and on the principal surface of the first substrate.

11. A front-end module comprising:
the composite component according to claim 1; and
a power amplifier,
wherein the power amplifier is disposed outside the composite component.

12. The composite component according to claim 1, wherein the transmitting filter includes a resonant circuit; and
the resonant circuit is disposed in the internal space and on the principal surface of the first substrate.

13. The composite component according to claim 1, further comprising a receiving filter,
wherein the receiving filter is disposed in the internal space and on the principal surface of the second substrate.

14. The composite component according to claim 2, further comprising a receiving filter,
wherein the receiving filter is disposed in the internal space and on the principal surface of the second substrate.

15. The composite component according to claim 2, wherein the spacer member is a metal conductor.

16. The composite component according to claim 3, wherein the spacer member is a metal conductor.

17. The composite component according to claim 1, further comprising:
a plurality of first substrate-side filters arranged on an upper surface of the first substrate; and
a plurality of second substrate-side filters arranged on a lower surface of the second substrate,
wherein, of the plurality of first and second substrate-side filters, the corresponding first and second substrate-side filters arranged to coincide with each other in a plan view have respective pass bands set in different frequency bands.

18. The composite component according to claim 2, further comprising:
a plurality of first substrate-side filters arranged on an upper surface of the first substrate; and
a plurality of second substrate-side filters arranged on a lower surface of the second substrate,
wherein, of the plurality of first and second substrate-side filters, the corresponding first and second substrate-side filters arranged to coincide with each other in a plan view have respective pass bands set in different frequency bands.

19. The composite component according to claim 1, wherein the spacer member is disposed on the principal surface of the first substrate.

\* \* \* \* \*